(12) United States Patent
Williams et al.

(10) Patent No.: US 7,462,916 B2
(45) Date of Patent: Dec. 9, 2008

(54) SEMICONDUCTOR DEVICES HAVING TORSIONAL STRESSES

(75) Inventors: Richard Q. Williams, Essex Junction, VT (US); Dureseti Chidambarrao, Weston, CT (US); John J. Ellis-Monaghan, Grand Isle, VT (US); Shreesh Narasimha, Beacon, NY (US); Edward J. Nowak, Essex Junction, VT (US); John J. Pekarik, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 11/458,461

(22) Filed: Jul. 19, 2006

(65) Prior Publication Data

US 2008/0020531 A1   Jan. 24, 2008

(51) Int. Cl.
  *H01L 29/76* (2006.01)
(52) U.S. Cl. .............. 257/395; 257/396; 257/397; 257/506; 257/524; 257/E29.02
(58) Field of Classification Search ............ 257/347, 257/395–397, 506, 507, 524, E29.018, E29.02
See application file for complete search history.

(56) References Cited

U.S. PATENT DOCUMENTS

| | | | |
|---|---|---|---|
| 6,717,216 B1 | 4/2004 | Doris et al. | |
| 6,867,433 B2 * | 3/2005 | Yeo et al. | 257/67 |
| 6,884,667 B1 | 4/2005 | Doris et al. | |
| 6,974,981 B2 | 12/2005 | Chidambarrao et al. | |
| 7,018,551 B2 | 3/2006 | Beintner et al. | |
| 7,052,964 B2 * | 5/2006 | Yeo et al. | 438/296 |
| 7,221,024 B1 * | 5/2007 | Chidambarrao et al. | 257/347 |
| 2004/0113174 A1 | 6/2004 | Chidambarrao et al. | |
| 2005/0130358 A1 | 6/2005 | Chidambarrao et al. | |
| 2006/0057787 A1 | 3/2006 | Doris et al. | |

OTHER PUBLICATIONS

U.S. Appl. No. 11/163,686, filed Oct. 27, 2005 entitled "Transistor Having Dielectric Stressor Elements for Applying In-Plane Shear Stress".

* cited by examiner

*Primary Examiner*—Matthew E Warren
(74) *Attorney, Agent, or Firm*—H. Daniel Schnurmann; Daryl K. Neff (57) ABSTRACT

A FET structure is provided in which at least one stressor element provided at or near one corner of an active semiconductor region applies a stress in a first direction to one side of a channel region of the FET to apply a torsional stress to the channel region of the FET. In a particular embodiment, a second stressor element is provided at or near an opposite corner of the active semiconductor region to apply a stress in a second direction to an opposite side of a channel region of the FET, the second direction being opposite to the first direction. In this way, the first and second stressor elements cooperate together in applying a torsional stress to the channel region of the FET.

4 Claims, 5 Drawing Sheets

SEMICONDUCTOR DEVICES HAVING TORSIONAL STRESSES

BACKGROUND OF THE INVENTION

The present invention relates to semiconductor devices, and more particularly semiconductor devices in which torsional stresses are applied to channel regions thereof.

It is known that improved performance can be derived from a silicon device such as a field effect transistor when a stress of a sufficient magnitude and type is applied in a particular direction to the channel region of the device. A beneficial stress applied to the channel region of a field effect transistor ("FET") can increase the amount of current that the FET conducts when it is turned on. Conversely, when a detrimental stress is applied to the channel region of a FET, the amount of current conducted by the FET decreases. Thus, for example, the performance of an n-type field effect transistor ("NFET") provided in silicon can be improved when a relatively large tensile stress is applied to the device's channel region in a longitudinal direction, i.e., the direction of the length of the channel between the source and drain. On the other hand, the performance of a p-type field effect transistor ("PFET") provided in silicon can be improved when a relatively large compressive stress is applied to the device's channel region in the longitudinal direction.

Various ways are known for applying stresses in the longitudinal direction to semiconductor devices. However, such ways can involve cumbersome processing and results can be difficult to control. Accordingly, more and better ways are sought for applying a stress to the channel region of a semiconductor device for altering the amount of current conducted by the device.

SUMMARY OF THE INVENTION

Accordingly, in a first embodiment of the invention, a field effect transistor or ("FET") is provided in which a first stressor element provided at or near one corner of an active semiconductor region applies a stress in a first direction to one side of a channel region of the FET to apply a torsional stress thereto. Optionally, a second stressor element is provided at or near an opposite corner of the active semiconductor region from the first stressor element to apply stress in a second direction to an opposite side of a channel region of the FET, the second direction being opposite to the first direction. In this way, the first and second stressor elements cooperate together to apply a torsional stress to the channel region of the FET.

In a particular embodiment, a chip or substrate is provided which includes an isolation region having a plurality of inner edges defining a bounded area, the inner edges including a first edge and a second edge remote from the first edge, as well as a third edge and a fourth edge remote from the third edge, wherein the third and fourth edges extend between the first and second edges. An active semiconductor region is disposed within the bounded area, the active semiconductor region having a longitudinal direction in a direction between the first and second edges and a transverse direction in a direction between the third and fourth edges. A field effect transistor ("FET") is provided within the active semiconductor region, having a channel region, a source region and a drain region disposed within the active semiconductor region, wherein a length of the channel region is oriented in the longitudinal direction, and a width of the channel region is oriented in the transverse direction. A first stressor element is disposed within the bounded area which is closer to the first and third edges than to the second and fourth edges. A second stressor element is also disposed within the bounded area, the second stressor element being closer to the second and fourth edges than to the first and third edges. In this way, the first stressor element applies a first stress to the active semiconductor region in a first direction and the second stressor element applies a second stress to the active semiconductor region in a second direction such that the first and second stresses cooperate together to apply a torsional stress to the active semiconductor region.

According to another aspect of the invention, a chip or substrate is provided which includes a substrate having a major surface which extends in first and second horizontal directions. An active semiconductor region is provided within the substrate which includes a fin-like region having vertical walls, the fin-like region including a source region, a drain region and channel region between the source and drain regions. A first stressor element is disposed at an edge of the source region and a second stressor element is disposed at an edge of the drain region. In this way, the first stressor element applies a first stress in a first direction to the active semiconductor region and the second stressor element applies a second stress to the active semiconductor region in a second direction opposite to the first direction.

According to another aspect of the invention, a method is provided for making a field effect transistor which includes a fin-like channel region. In such method, an active semiconductor region is provided which includes a first region, a second region and a fin-like region extending between the first and second regions. Within the fin-like region a first region, a second region, and a channel region are provided, the channel region extending between the first and second regions. A first stressor element is formed at an edge of the first region and a second stressor element is formed at an edge of the second region, such that the first stressor element applies a first stress in a first direction to the channel region and the second stressor element applies a second stress to the channel region in a second direction opposite to the first direction. After forming the first and second stressor elements an implanting step is performed to form a first source-drain region within the active semiconductor region including within the first region of the fin-like region and to form a second source-drain region including within the second region of the fin. In a preferred embodiment, this combination of fin-like structures (finFET structure) includes at least three stressor elements and two fins, and each fin includes a channel region and first and second source-drain regions.

In other embodiments, finFET structures which include higher numbers of fin-like structures and higher numbers of alternating stressor elements can be provided and fabricated.

DETAILED DESCRIPTION

A semiconductor structure including a field effect transistor ("FET") 10 according to an embodiment of the invention will now be described with reference to the sectional diagram thereof in FIG. 1A and the corresponding face up plan view of FIG. 1B. For purposes of illustration and ease of description, it is helpful to provide a frame of reference for locating the elements of the semiconductor structure and FET in relation to each other. The directions of a compass: i.e., north, south, east and west provide a useful frame of reference for describing the semiconductor structure. These directions are indicated by the legend 101. These directions need not coincide with the true north, south, east and west directions, since the FET 10 can operate in any orientation, at any angle towards the true north direction. Rather, the directions indicated by legend 101 are useful in describing the placement and orientation of various elements of the FET 10 in relation to each other.

Figure 1A:
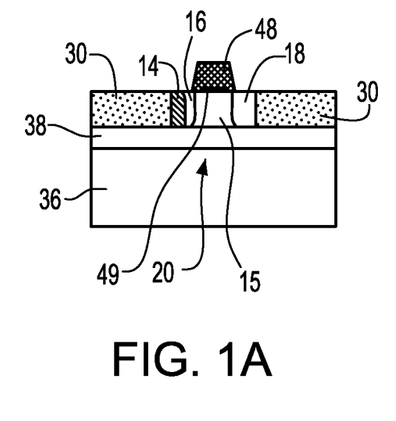
FIG. 1A is a sectional view is a sectional view of a FET structure in accordance with one embodiment of the invention, the section being taken through line X-X' of FIG. 1B.

As illustrated in FIG. 1A, an active semiconductor region 20 is flanked by an isolation region 30. Preferably, the active semiconductor region 20 is provided in a silicon-on-insulator ("SOI") layer, which is separated from a bulk semiconductor region 36 by a buried dielectric layer, e.g., buried oxide ("BOX") layer 38. Alternatively, the active semiconductor region 20 can be provided in a substrate such as a bulk silicon wafer which does not include a BOX layer.

Figure 1B:
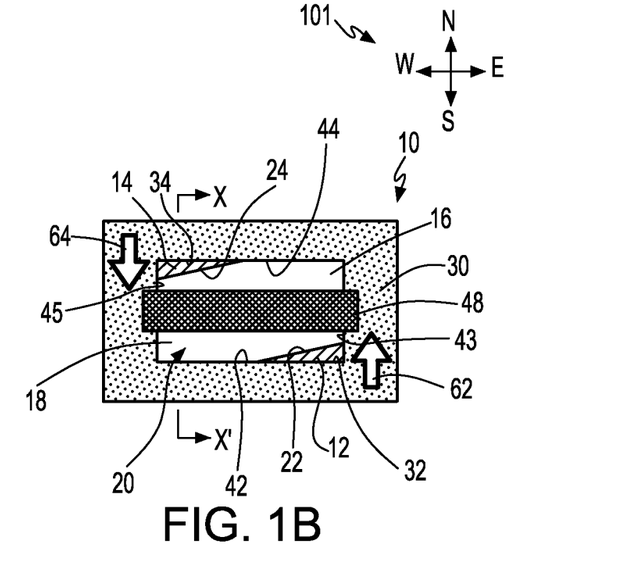
FIG. 1B is a face-up plan view of the FET structure illustrated in FIG. 1A.

Referring to FIG. 1B, preferably, the isolation region 30 includes a sidewall trench isolation ("STI") region and the entire active semiconductor region 20 is disposed within an area surrounded by the STI region. A first stressor element 12 and a second stressor element 14 are provided between the STI region 30 and the active semiconductor region 20, these stressor elements extending from first and second inner edges 32, 34 of the STI region and first and second peripheral edges 22, 24 of the active semiconductor region 20, respectively. The peripheral edges 22 and 24 are disposed at locations diagonally across the active semiconductor region from each other. Preferably, the first and second stressor elements have triangular shape. Thus, the first stressor element 12 preferably contacts the inner edge 32 of the active semiconductor region 10 that extends from a south edge 42 to an east edge 43 of the active semiconductor region. Similarly, the, second stressor element 14 preferably contacts the inner edge 34 of the active semiconductor region 20 that extends from a north edge 44 to a west edge 45 of the active semiconductor region.

As further illustrated in FIGS. 1A and 1B, a gate 48 extends above a channel region 15 of the active semiconductor region from the east edge 43 to the west edge 45. The gate runs parallel to and is separated from the channel region 15 by a gate dielectric 49. The channel region 15 is disposed between a first source-drain region 16 and a second source-drain region 18 within the active semiconductor region.

Figure 2A:
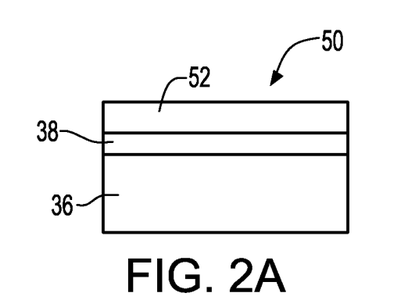
FIG. 2A is a sectional view illustrating a stage in fabricating the FET structure shown in FIGS. 1A-1B, in accordance with an embodiment of the invention.
Figure 2B:
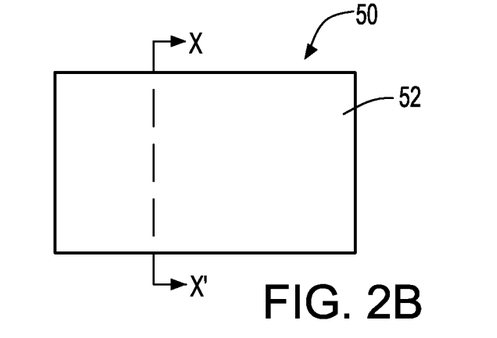
FIG. 2B is a face-up plan view corresponding to the sectional view illustrated in FIG. 2A.
Figure 3A:
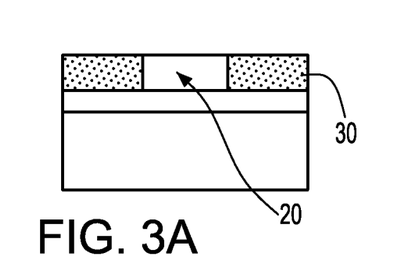
FIGS. 3A and 3B are a sectional view and corresponding face-up plan view illustrating a stage of fabrication subsequent to that shown in FIGS. 2A and 2B.
Figure 3B:
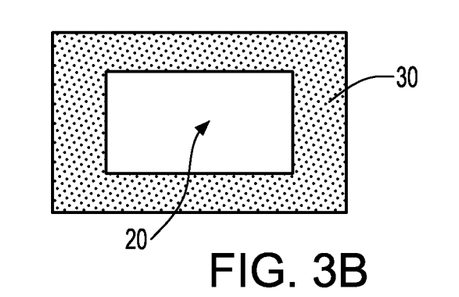

A method of fabricating the semiconductor structure including FET 10 will now be described, beginning with the sectional view of FIG. 2A and the corresponding face up plan view of FIG. 2B. The semiconductor structure is preferably fabricated from a silicon-on-insulator ("SOI") substrate, i.e., a substrate which includes an SOI layer 52 that is separated from a bulk region 36 of the substrate by a BOX layer 38. As illustrated in FIGS. 3A and 3B, the SOI layer 52 is now patterned to form the STI region 30, with a portion of the SOI layer remaining as the active semiconductor region 20 surrounded by the STI region.

Figure 4A:
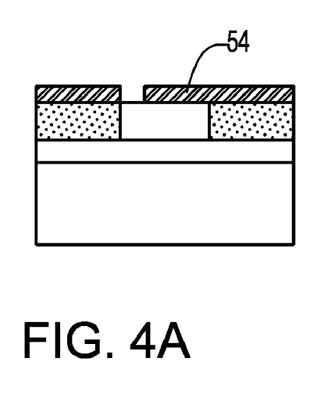
FIGS. 4A and 4B are a sectional view and corresponding face-up plan view illustrating a stage of fabrication subsequent to that shown in FIGS. 3A and 3B.
Figure 4B:
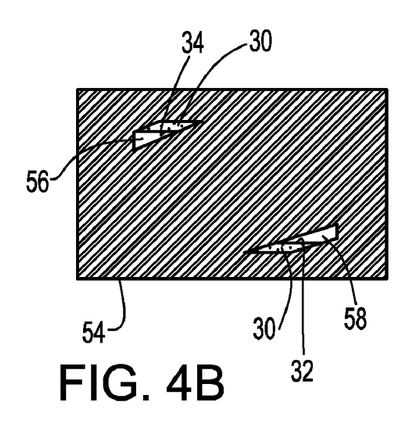

Thereafter, as illustrated in FIGS. 4A and 4B, a masking layer 54 is deposited and patterned to expose a first portion 56 of the active semiconductor region at or near the northwest corner of the active semiconductor region and a second portion 58 of the active semiconductor region at or near a southeast corner of the active semiconductor region. Preferably, the exposed portions 56, 58 of the active semiconductor region have triangular shape and the exposed portions 56, 58 adjoin the corresponding inner edges 34, 32 of the STI region 30, as illustrated in FIG. 4B. In the particular embodiment illustrated in FIG. 4B, openings in the masking layer 54 have rectangular shape and are formed in such way as to overlap the inner edges 34, 32 of the STI region 30.

The rectangular openings in the masking layer can be achieved by the following process, for example. A photoimageable layer such as a photoresist is deposited and exposed using a photomask having parallel spaced apart rectangular openings. When preparing to expose the photoimageable layer, the substrate with the masking layer thereon is rotated a partial turn until the rectangular openings in the photomask are oriented at a desired angle with respect to the inner edges 34, 32 of the STI region. In this way, the openings in the masking layer produced by the exposure are oriented at or about the same angle with respect to the inner edges 34, 32 of the STI region.

Figure 5A:
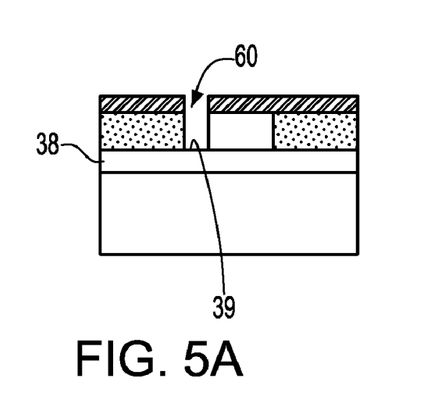
FIGS. 5A and 5B are a sectional view and corresponding face-up plan view illustrating a stage of fabrication subsequent to that shown in FIGS. 4A and 4B.
Figure 5B:
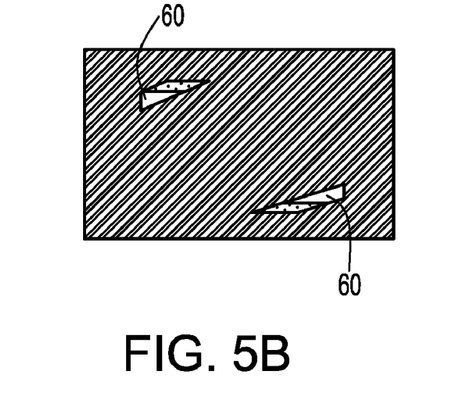

Next, as illustrated in FIGS. 5A-5B, openings 60 are formed in the semiconductor material (e.g., silicon) which correspond to the portions 56, 58 (FIGS. 4A-4B) of the active semiconductor region which are exposed by the masking layer. In one embodiment, the openings in the semiconductor material are formed by an etch process until a top surface 39 of the buried dielectric layer 38 is exposed. Such etching process can be performed, for example, by a vertical etch process such as a reactive ion etch ("RIE"). Alternatively, the openings 60 in the semiconductor material can be removed by another etch process which is not as directional (vertical), such as by etching selective to a dielectric material, e.g., silicon dioxide and/or silicon nitride, included in the STI region 30 and selective to silicon dioxide such as included in the buried dielectric layer 38.

Figure 6:
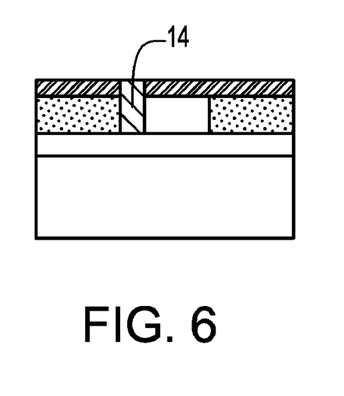
FIG. 6 is a sectional view illustrating a stage of fabrication subsequent to that shown in FIGS. 5A and 5B.

Thereafter, as illustrated in FIG. 6, a material is deposited within the openings 60. After deposition and optional additional processing steps that may include annealing, the deposited material remains as stressor elements 12, 14 (FIGS. 1A-1B) which exhibit an internal stress. In one embodiment, the internal stress produced by the deposited material is compressive, such that the stressor elements 12, 14 (FIGS. 1A-1B) exert stresses upon the active region in directions indicated by arrows 62, 64, respectively. In such case, the stressor elements 12, 14 apply a torsional stress to the channel region 15 of the FET 10. In such embodiment, the active semiconductor region 20 can include a semiconductor material, for example, which consists essentially of silicon and compressively stressed stressor elements 12, 14 can be formed by epitaxially growing a semiconductor layer within the openings 60 which includes a semiconductor alloy such as silicon germanium (SiGe). SiGe is known to become compressively stressed when epitaxially grown onto a surface of a single-crystal semiconductor layer consisting essentially of silicon.

In another embodiment, the internal stress produced by the deposited material is tensile, such that each of the stressor elements 12, 14 (FIGS. 1A-1B) exert stresses upon the active region in directions opposite to the directions indicated by arrows 62, 64, respectively to apply a torsional stress to the channel region 15 of the FET 10. To produce such tensile-stressed stressor elements, the active semiconductor region 20 can include a semiconductor material which consists essentially of a semiconductor alloy such as SiGe and the stressor elements 12, 14 be formed by epitaxially growing a semiconductor layer having a composition different from the active semiconductor region within the openings 60. For example, the epitaxial layer within openings 60 can be grown using a semiconductor material which consists of a tension-inducing material such as silicon or which has a lower percentage content of germanium than the active semiconductor region 20. In this tensile stressor embodiment, the stressor regions may be larger, occupying greater area of the active semiconductor region than in the analogous compressive stressor embodiment, and subsequent thermal processing may be applied.

Figure 7:
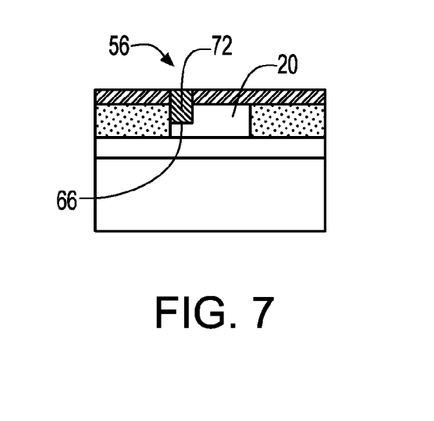
FIG. 7 is a sectional view illustrating a method of fabricating a FET structure in accordance with a variation of the embodiment illustrated in FIGS. 1A through 6.

In another embodiment illustrated in FIG. 7, the etching process removes only a portion of the thickness of the active semiconductor region 20 exposed within the openings (e.g., opening 56). In such case, the stressor element 72 is formed by the above-described process of epitaxially growing a layer of SiGe or silicon within the opening. The resulting stressor element 72 overlies and is vertically aligned with a portion 66 of the SOI layer within the active semiconductor region 20. Such stressor element 72, having partial depth with respect to the depth of the buried oxide below the opening 56, allows additional torsional components to be applied to the channel.

Figure 8:
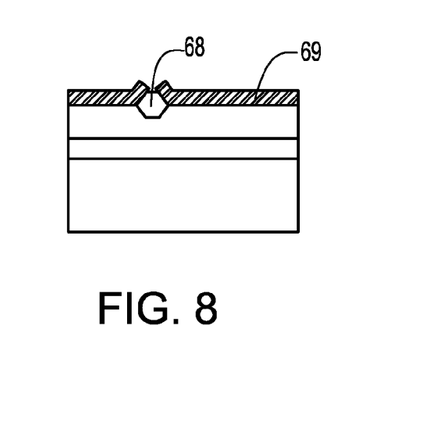
FIG. 8 is a sectional view illustrating a method of fabricating a FET structure in accordance with another variation of the embodiment illustrated in FIGS. 1A through 6.

In another variation of the above-described embodiments, the stressor elements 12, 14 (FIG. 1B) include an oxide region 68 (FIG. 8) formed by local oxidation of the semiconductor material that is exposed within an opening in an appropriate the masking layer 69. In this case, the masking layer 69 preferably includes hard mask layer(s) such as an oxide and/or nitride of silicon, for example. The openings in the masking layer 69 correspond to openings 56, 58 as illustrated in FIG. 4B. After such openings are formed, the substrate is subjected to local oxidation process (e.g., by heating the substrate within an environment containing oxygen) to form stressor elements 12, 14 (FIG. 1B) such as the oxide stressor element 68 illustrated in FIG. 8. Alternatively, other process flows are contemplated in which the stressor elements include other materials such as silicon nitride.

Figure 9:
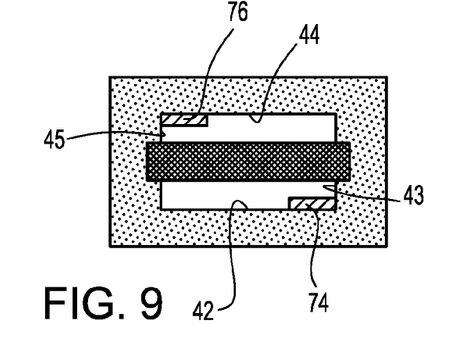
FIG. 9 is a sectional view illustrating a method of fabricating a FET structure in accordance with another variation of the embodiment illustrated in FIGS. 1A through 6.

In a variation of the above-described embodiments, the stressor elements 74, 76 (FIG. 9) are disposed adjacent to the south and east edges 42, 44 and the north and west edges 44, 45 of the STI region, as in the above-described embodiment (FIGS. 1A-1B). However, in this case, the stressor elements have at least some edges aligned parallel to the north and south edges 44, 42 of the STI region. In this case, photolithographic processes used to define the locations of the stressor elements align the openings in the masking layer produced by photolithographic patterning are aligned parallel to the edges of the STI region.

In another variation, the structure including FET 10 includes only one stressor element such as described above with reference to any of the foregoing embodiments, and the second stressor element is omitted. In such case, the one stressor element applies a torsional stress to the channel region of the FET, although with somewhat less effect than when two stressor elements are present.

Figure 10A:
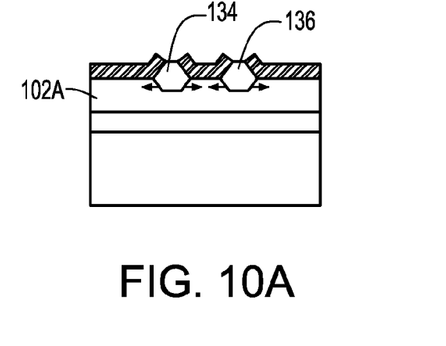
FIG. 10A is a sectional view through line A-A' of FIG. 10B, illustrating stressor elements included within a finFET structure having a torsional stress applied thereto, in accordance with a particular embodiment of the invention.
Figure 10B:
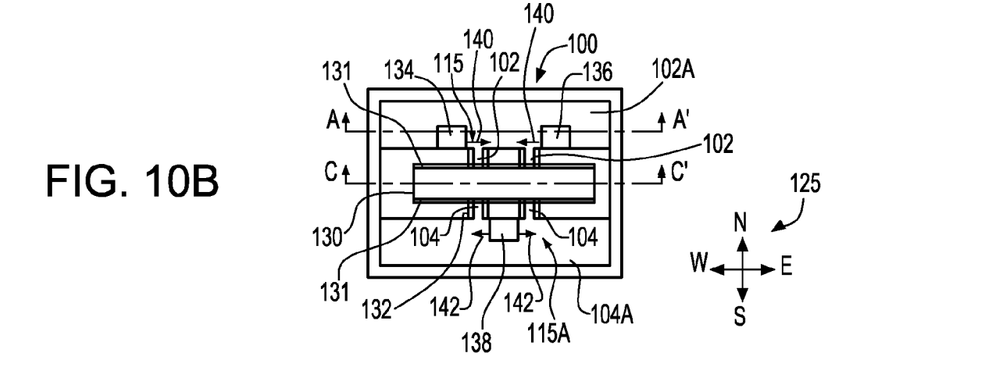
FIG. 10B is a corresponding face-up plan view of the finFET structure.
Figure 10C:
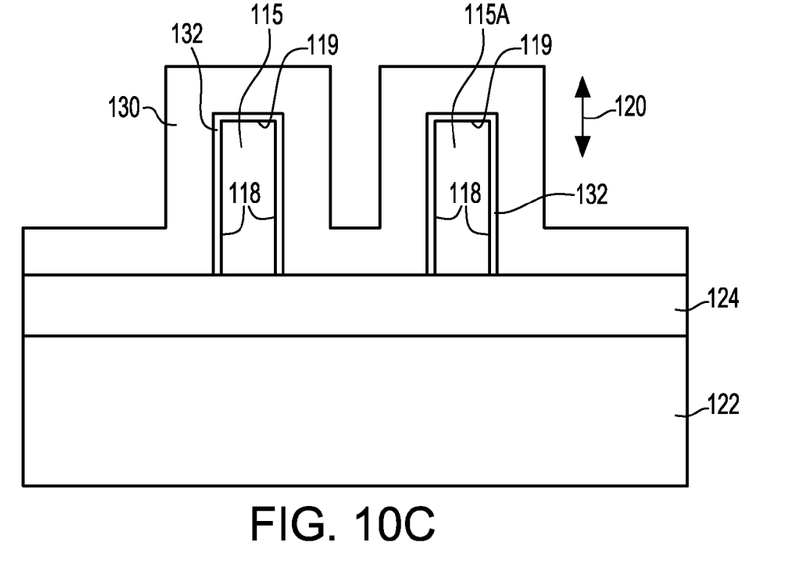
FIG. 10C is a further sectional view of the finFET structure through line C-C' of FIG. 10B.

Referring to FIGS. 10A through 10C, a structure including a finFET 100 is provided in accordance with another embodiment of the invention. In such embodiment, a plurality of stressor elements applies a torsional stress to one or more channel regions of the finFET 100. As in the above-described embodiments, in describing the location and orientation of features within the finFET structure relative to each other, it is helpful to utilize a frame of reference which includes compass directions, i.e., north, south, east, and west, as indicated by legend 125. As in the above example, the directions indicated by legend 125 need not coincide with the true compass directions of north, south, east and west, since the finFET 100 can be operated regardless of the angle at which it is oriented to true north.

Referring to the face-up plan view provided in FIG. 10B, the finFET 100 includes a pair of fin-shaped regions or fins 115 and 115A which extend in the north-south direction. Each fin has a structure which includes a first source-drain region 102 and a second source-drain region 104. A channel region (not visible in FIG. 10B) is provided between the first and second source-drain regions, over which a gate conductor 130 is disposed, separated from the fin by a gate dielectric (also not visible in the view of FIG. 10B). Each of the individual first source-drain regions 102 in the fins are tied together by an extended source-drain region 102A. Likewise, each of the individual second source-drain regions 104 in the fins is tied to the other individual source-drain region by an extended source-drain region 104A. These extended source-drain regions 102A, 104A have major surfaces which extend in horizontal directions aligned with the plane defined by the north-south and east-west directions. Stressor elements 134, 136 are disposed at the major surface of the first extended source-drain region 102A. Another stressor element 138 is disposed at the major surface of the second extended source-drain region 104A.

As best seen in the sectional view of FIG. 10C through line C-C', the two fins 115 have walls 118 which extend in a vertical direction or in an at least substantially vertical direction 120 which is normal to the major surface of the extended source-drain regions 102A, 104A. The gate conductor 130 extends covers the channel region of the fins, as separated therefrom by the gate dielectric 132. The fins and the extended source-drain regions are provided within an SOI layer of an SOI substrate, the SOI layer overlying a bulk semiconductor region 122 of the substrate, as separated therefrom by a buried dielectric layer 124.

FIG. 10A is a sectional view through line A-A', illustrating the stressor elements 134 and 136. As shown therein, the stressor elements 134, 136 include locally oxidized regions of semiconductor material, e.g., silicon, from which the extended source-drain region 102A is provided. Silicon dioxide occupies greater volume than silicon, such that during the formation of the stressor elements by local oxidation of silicon, the stressor elements become compressively stressed. These stressor elements 134, 136 exert forces in outward directions from the stressor elements, including in the east-west directions indicated by the arrows 140 in FIGS. 10A and 10B. As further shown in FIG. 10B, another stressor element 138 is provided in the second extended source-drain region 104, this stressor element 138 having a similar construction as stressor elements 134, 136, being formed by local oxidation of silicon, for example. This stressor element exerts forces in outward (east-west) directions indicated by arrows 142.

The forces exerted by the stressor elements combine to apply torsional stresses to the two fins 115, and 115A. A torsional stress results in fin 115 by stress applied to a first fin 115 in the west to east direction by stressor element 134 at an edge of region 102A, together with stress applied to that fin in the opposite (east to west) direction by stressor element 138 at an edge of region 104A. Similarly, a torsional stress results in fin 115A by stress applied to the second fin 115A in the east to west direction by stressor element 136 at an edge of region 102A, together with stress applied to that fin in the opposite (west to east) direction by stressor element 138 at an edge of region 104A. As in the planar torsional stressor embodiments, the stressor elements can have full depth, in which case they extend to the buried oxide layer, or they can have partial-depth, in which case portions of the SOI layer underlie the stressor elements in alignment with the stressor elements. Partial-depth stressor elements allow additional torsional components to be applied to the channel region of the FET.

Figure 11A:
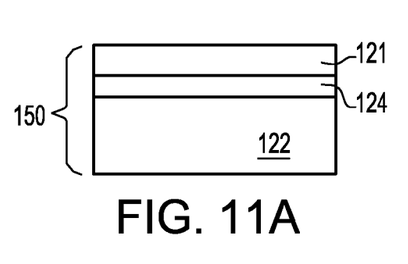
FIG. 11A is a sectional view through line A-A' of FIG. 11B, illustrating a stage in a method of fabricating a finFET structure having a torsional stress applied thereto, in accordance with another embodiment of the invention.
Figure 11B:
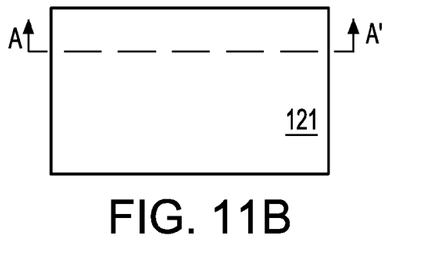
FIG. 11B is a face-up plan view corresponding to the stage of fabrication illustrated in FIG. 11A.

A method of fabricating the finFET structure shown in FIGS. 10A-C will now be described with reference to FIGS. 11A through 14B. The finFET structure is fabricated in an SOI layer 121 of an SOI substrate which includes a bulk semiconductor region 122 separated from the SOI layer 121 by a buried dielectric layer or buried oxide ("BOX") layer 124. FIG. 11B is a corresponding face-up plan view of the SOI layer 121.

Figure 12A:
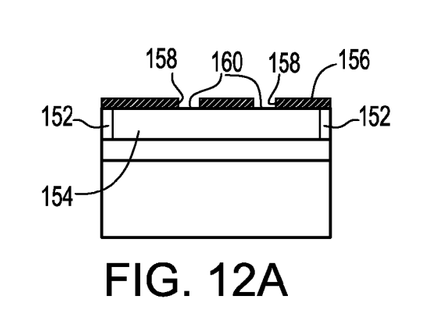
FIG. 12A is a sectional view through line A-A' of FIG. 12B illustrating a further stage in the method of fabricating a finFET structure subsequent to the stage of fabrication illustrated in FIGS. 11A-11B.
Figure 12B:
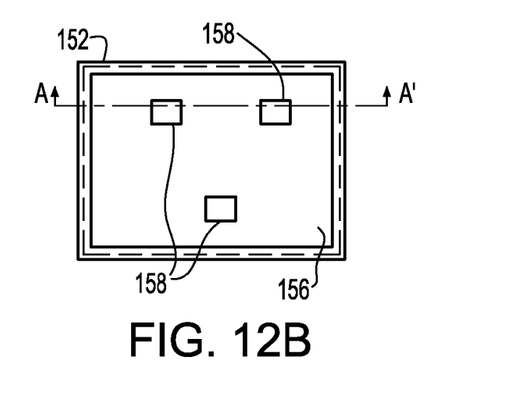
FIG. 12B is a face-up plan view corresponding to the stage of fabrication illustrated in FIG. 12A.

Next, as illustrated in FIGS. 12A-12B, an isolation region, preferably a shallow trench isolation ("STI") region 152 is formed. The STI region is formed by patterning a trench having a rectangular ring-like shape and depositing a dielectric material therein, especially silicon dioxide. The STI region 152 defines the location and boundaries of an active semiconductor region 154 that it surrounds. After forming the STI region 152, a masking layer 156 is deposited to overlie the active semiconductor region. For reasons which will become apparent below, the masking layer preferably includes a hard mask, and preferably includes a material such as silicon nitride. In a particular embodiment, the hard mask can include a relatively thin layer contacting the active semiconductor region 154 that consists essentially of an oxide, e.g., silicon dioxide, and which can be referred to as a pad oxide. The hard mask layer preferably also includes an additional thicker layer which consists essentially of silicon nitride, the additional layer being referred to as a "pad nitride" layer. Openings 158 are patterned in the hard mask which expose a major surface 160 of the active semiconductor region 154 below the openings. While the openings 158 illustrated in FIG. 12B appear to be rectangular in shape with sharp corners, the corners of the openings can be radiused, i.e., rounded. Alternatively, the openings 158 can have oblong, circular or oval (i.e., elliptical) shape.

Figure 13A:
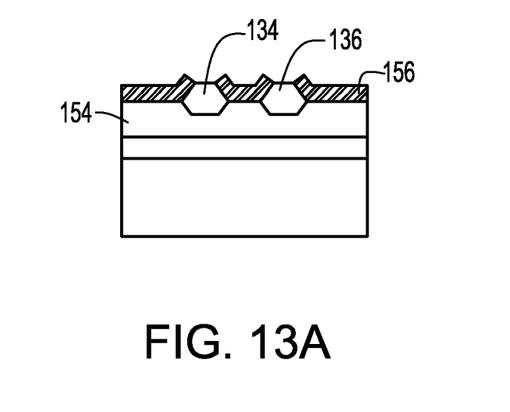
FIG. 13A is a sectional view illustrating a further stage in the method of fabricating a finFET structure subsequent to the stage of fabrication illustrated in FIGS. 12A-12B.
Figure 13B:
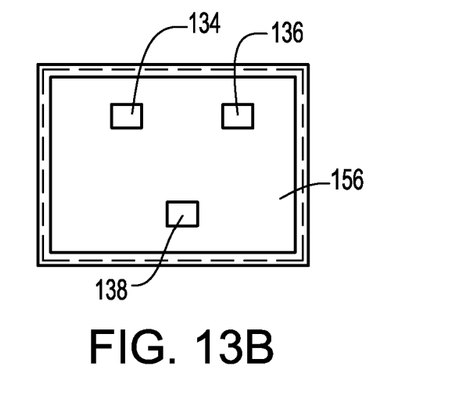
FIG. 13B is a face-up plan view corresponding to the stage of fabrication illustrated in FIG. 13A.
Figure 14A:
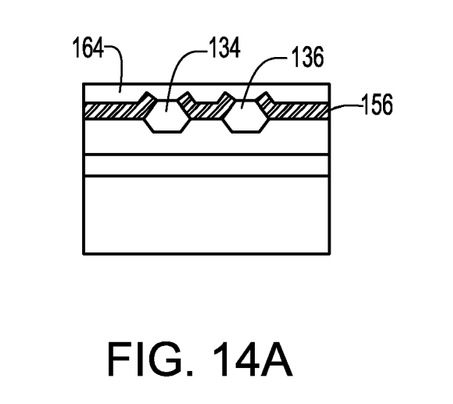
FIG. 14A is a sectional view through line A-A' of FIG. 14B, illustrating a further stage in the method of fabricating a finFET structure subsequent to the stage of fabrication illustrated in FIGS. 13A-13B.
Figure 14B:
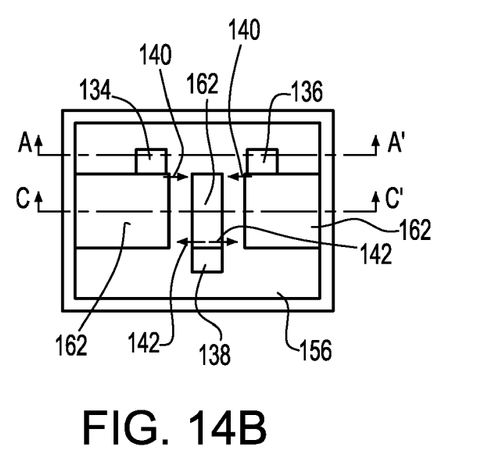
FIG. 14B is a face-up plan view corresponding to the stage of fabrication illustrated in FIG. 14A.
Figure 14C:
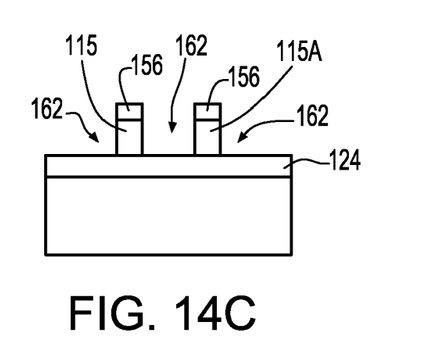
FIG. 14C is a further sectional view through line C-C' of FIG. 14B, illustrating the stage in a method of fabricating a finFET structure.

Next, as illustrated in FIGS. 13A-13B, the substrate undergoes heat treatment in an oxygen ambient to form the stressor elements 134, 136 and 138 by local oxidation of areas of the active semiconductor region 154 exposed within the openings in the masking layer 156. As illustrated in FIGS. 14A-14B, the stressor elements exert stresses upon the active semiconductor region in directions which include those indicated by arrows 140 and 142. Thereafter, additional openings 162 are patterned in the hard mask layer 156, e.g., by depositing and photolithographically patterning a photoresist mask 164, and thereafter forming corresponding openings in the hard mask layer. The active semiconductor region is then patterned in accordance with the openings 162 in the hard mask layer by etching, preferably by a vertical etch process such as a reactive ion etch. As a result of such patterning, portions of the active semiconductor region exposed by openings 162 in the hard mask layer 156 are removed until the buried dielectric layer 124 (FIG. 10) is exposed. Portions of the active semiconductor region which are protected by the hard mask layer 156 now remain as the fins 115 and 115A.

After such patterning, the hard mask layer is now removed, first by selectively etching the pad nitride component thereof in a manner which selectively preserves the relatively thin pad oxide portion, after which the pad oxide portion is removed. Thereafter, a thermal oxidation process can be used to grow a gate oxide 132 having a desirable thickness on the exposed surfaces of the fins 115, 115A (including the walls 118 and top surfaces 119 of the fins (FIG. 10C)). The gate conductor 130 is then deposited and patterned to cover portions of the fins, after which dopants are implanted to define locations and dopant concentrations of the source-drain regions 102, 104 and corresponding extended source-drain regions 102A, 104A, as illustrated in FIG. 10B. During the implantation steps, dielectric spacers 131 provided on walls of the gate conductor 130 can be used to define locations of extension regions and/or halo regions adjacent to the channel region in relation to edges of the more highly doped source-drain regions 102, 104 within the fins 115, 115A.

Various modifications and variations of the stressed finFET structure 100 can be made in accordance with further embodiments of the present invention. In one such variation, the stressor elements are provided by etching openings in the active semiconductor region corresponding to the openings 158 in the hard mask layer (FIG. 12A), and then growing epitaxial layers which include a compressively stressed semiconductor material. For example, when the active semiconductor region 154 consists essentially of silicon, epitaxial layers which have a composition including silicon germanium can be grown within the openings to form stressor elements which exert compressive stresses. Alternatively, when the active semiconductor region 154 includes silicon germanium having a particular germanium content, stressor elements 134, 136, 138 can be provided which exert a tensile stress upon the active semiconductor region 154 by epitaxially growing a layer of semiconductor material within the openings which either consists essentially of silicon or which includes silicon germanium having a lower germanium content than that of the active semiconductor region generally.

Figure 15:
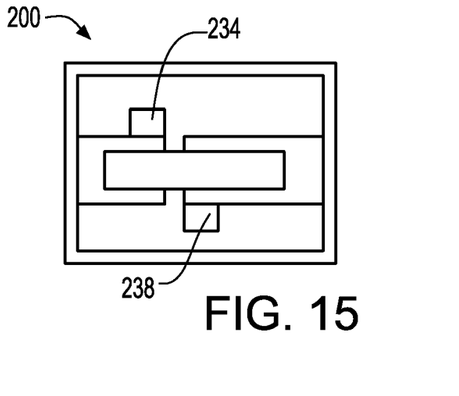
FIG. 15 is a face-up plan view illustrating a finFET structure according to a variation of the embodiment shown in FIGS. 10A-10C.

FIG. 15 illustrates a finFET structure 200 in accordance with a further variation of the embodiment illustrated in FIGS. 10A-10C. In this embodiment, finFET structure 200 includes a single fin 215 and need only include two stressor elements 234 and 238, as indicated in FIG. 15. The stressor elements 234, 238 are formed in similar manner to that described in accordance with the embodiment illustrated in FIGS. 10A through 14C or in a manner in accordance with the above-described variations of such embodiment.

In another variation, any of the finFET structures described above with respect to the foregoing embodiments can be provided by etching one or more fin-like structures into a bulk silicon wafer. Fin-like structures can be formed from a bulk silicon wafer by suitable changes in the process flow, such as the use of a timed anisotropic etch.

While the invention has been described in accordance with certain preferred embodiments thereof, many modifications and enhancements can be made thereto without departing from the true scope and spirit of the invention, which is limited only by the claims appended below.

What is claimed is:

1. A semiconductor device, comprising:
a trench isolation region having a plurality of inner edges defining a bounded area, said inner edges including a first edge and a second edge remote from and parallel to said first edge, and further including a third edge extending between said first and second edges and a fourth edge extending between said first and second edges, said fourth edge being remote from and parallel to said third edge;
an active semiconductor region disposed within said bounded area, said active semiconductor region having a longitudinal direction in a direction extending between said first and second edges and a transverse direction in a direction between said third and fourth edges,
a field effect transistor ("FET") having a channel region, a first source-drain region and a second source-drain region disposed within said active semiconductor region, a length of said channel region being oriented in said longitudinal direction, and a width of said channel region being oriented in said transverse direction;
a first triangle-shaped stressor element disposed within said bounded area having an edge extending from said first edge to said third edge of said trench isolation region, said first stressor element applying a first stress to said active semiconductor region in a first direction to apply a first torsional stress to said active semiconductor region; and
a second triangle-shaped stressor element disposed within said bounded area having an edge extending from said second edge to said fourth edge of said trench isolation region, said second stressor element applying a second stress to said active semiconductor region in a second direction to apply a second torsional stress to said active semiconductor region.

2. The semiconductor device as claimed in claim 1, wherein said first and second stressor elements apply compressive stresses to said active semiconductor region.

3. The semiconductor device as claimed in claim 1, wherein said active semiconductor region has a first semiconductor composition and each of said first and second stressor elements having a second semiconductor composition, said second semiconductor composition being different from said first semiconductor composition, said difference between said first and second semiconductor compositions causing said first and second stressor elements to apply tensile stresses to said active semiconductor region.

4. The semiconductor device as claimed in claim 1, wherein each of said first and second stressor elements includes an oxide or a nitride of silicon.

* * * * *